United States Patent
Bridges

(10) Patent No.: US 10,061,089 B2
(45) Date of Patent: Aug. 28, 2018

(54) FIBER OPTIC COMPONENT HOLDING DEVICE FOR FIBERS IN SIDE-BY-SIDE CONTACT

(71) Applicant: ADVA Optical Networking SE, Meiningen (DE)

(72) Inventor: Rodney Bridges, Lilburn, GA (US)

(73) Assignee: ADVA OPTICAL NETWORKING SE, Meiningen (DE)

( * ) Notice: Subject to any disclaimer, the term of this patent is extended or adjusted under 35 U.S.C. 154(b) by 261 days.

(21) Appl. No.: 14/032,275

(22) Filed: Sep. 20, 2013

(65) Prior Publication Data

US 2015/0086170 A1    Mar. 26, 2015

(51) Int. Cl.
| | |
|---|---|
| *G02B 6/36* | (2006.01) |
| *H05K 3/30* | (2006.01) |
| *H05K 1/02* | (2006.01) |
| *G02B 6/44* | (2006.01) |

(52) U.S. Cl.
CPC ......... *G02B 6/3616* (2013.01); *G02B 6/4471* (2013.01); *H05K 3/301* (2013.01); *G02B 6/4454* (2013.01); *H05K 1/0274* (2013.01); *H05K 2201/10121* (2013.01); *H05K 2201/10606* (2013.01)

(58) Field of Classification Search
None
See application file for complete search history.

(56) References Cited

U.S. PATENT DOCUMENTS

| | | | | |
|---|---|---|---|---|
| 4,325,526 | A * | 4/1982 | Kitagawa ........................ 248/73 |
| 4,635,886 | A * | 1/1987 | Santucci et al. ................ 248/73 |
| 4,836,803 | A * | 6/1989 | Seidel ........................... 439/447 |
| 5,146,532 | A * | 9/1992 | Hodge ........................... 385/136 |
| 5,572,617 | A * | 11/1996 | Bernhardt et al. ............. 385/135 |
| 5,625,737 | A * | 4/1997 | Saito ............................. 385/137 |
| 5,715,348 | A * | 2/1998 | Falkenberg et al. .......... 385/135 |
| 5,893,539 | A * | 4/1999 | Tran et al. ................... 248/68.1 |
| 5,921,402 | A * | 7/1999 | Magenheimer ................ 211/26 |
| 6,249,635 | B1 * | 6/2001 | Daoud ........................... 385/137 |
| 6,249,636 | B1 * | 6/2001 | Daoud ........................... 385/137 |
| 6,259,851 | B1 * | 7/2001 | Daoud ........................... 385/135 |
| 6,285,815 | B1 * | 9/2001 | Daoud ........................... 385/137 |
| 6,354,543 | B1 * | 3/2002 | Paske .......................... 248/68.1 |
| 6,421,494 | B1 * | 7/2002 | Battey et al. ................. 385/136 |
| 6,456,772 | B1 * | 9/2002 | Daoud ........................... 385/135 |
| 6,510,274 | B1 * | 1/2003 | Wu et al. ....................... 385/137 |
| 6,603,918 | B2 * | 8/2003 | Daoud et al. ................. 385/134 |
| 6,608,957 | B2 * | 8/2003 | Sudo et al. ................... 385/135 |
| 6,661,962 | B1 * | 12/2003 | Calvet et al. ................. 385/137 |

(Continued)

FOREIGN PATENT DOCUMENTS

| | | |
|---|---|---|
| WO | 9638752 | 12/1996 |
| WO | 9837447 | 8/1998 |
| WO | 2007024912 A1 | 3/2007 |

OTHER PUBLICATIONS

European Search Report corresponding to European Application No. 13192017.5 dated Jan. 17, 2014.

*Primary Examiner* — Andrew Jordan

(74) *Attorney, Agent, or Firm* — Maginot, Moore & Beck, LLP

(57) ABSTRACT

A holding device for holding cylindrical fiber optical components comprising at least one stackable body each having at least one recess adapted to receive cylindrical fiber optical components.

19 Claims, 8 Drawing Sheets

(56) References Cited

U.S. PATENT DOCUMENTS

| | | | |
|---|---|---|---|
| 6,671,447 B1* | 12/2003 | Gehrke | 385/135 |
| 6,678,456 B2* | 1/2004 | Etemad-Moghadam | 385/134 |
| 6,687,450 B1* | 2/2004 | Kempeneers et al. | 385/135 |
| 6,751,394 B2* | 6/2004 | Muller et al. | 385/135 |
| 6,771,871 B2* | 8/2004 | Krampotich et al. | 385/134 |
| 6,801,704 B1* | 10/2004 | Daoud et al. | 385/136 |
| 6,892,020 B2* | 5/2005 | Douglas et al. | 385/136 |
| 6,947,654 B2* | 9/2005 | Krampotich et al. | 385/134 |
| 7,228,048 B1* | 6/2007 | Dunfee et al. | 385/136 |
| 7,272,291 B2* | 9/2007 | Bayazit et al. | 385/135 |
| 7,318,567 B2* | 1/2008 | Mori et al. | 248/51 |
| 7,346,252 B2* | 3/2008 | Krampotich et al. | 385/134 |
| 7,394,963 B2* | 7/2008 | Hartlef | 385/135 |
| 7,418,186 B1* | 8/2008 | Grubish et al. | 385/137 |
| 7,463,810 B2* | 12/2008 | Bayazit et al. | 385/135 |
| 7,514,631 B2* | 4/2009 | Martin et al. | 174/97 |
| 7,523,898 B1* | 4/2009 | Barry et al. | 248/71 |
| 7,684,669 B2* | 3/2010 | Bayazit et al. | 385/135 |
| 7,734,139 B2* | 6/2010 | Rector, III | 385/136 |
| 7,764,858 B2* | 7/2010 | Bayazit et al. | 385/135 |
| 8,254,742 B2* | 8/2012 | Womack | 385/135 |
| 8,290,330 B2* | 10/2012 | Taylor et al. | 385/135 |
| 8,380,034 B2* | 2/2013 | Fleouter et al. | 385/135 |
| 8,559,784 B2* | 10/2013 | Ray et al. | 385/135 |
| 8,609,986 B2* | 12/2013 | Edmond | 174/68.1 |
| 8,758,041 B2* | 6/2014 | Bishop et al. | 439/404 |
| 8,770,532 B2* | 7/2014 | Ruiz et al. | 248/307 |
| 8,805,154 B2* | 8/2014 | Lin et al. | 385/137 |
| 8,824,850 B2* | 9/2014 | Garcia et al. | 385/135 |
| 8,851,430 B2* | 10/2014 | Mulzer | 248/74.2 |
| 8,879,881 B2* | 11/2014 | Cote et al. | 385/135 |
| 2002/0003940 A1* | 1/2002 | Araki et al. | 385/137 |
| 2002/0159744 A1* | 10/2002 | Daoud | 385/135 |
| 2002/0191939 A1* | 12/2002 | Daoud et al. | 385/135 |
| 2003/0091314 A1* | 5/2003 | Sudo et al. | 385/135 |
| 2003/0091316 A1* | 5/2003 | Wu et al. | 385/137 |
| 2004/0071431 A1* | 4/2004 | Trouchet et al. | 385/137 |
| 2004/0151465 A1* | 8/2004 | Krampotich et al. | 385/136 |
| 2007/0047891 A1* | 3/2007 | Bayazit et al. | 385/135 |
| 2007/0274662 A1* | 11/2007 | Bayazit et al. | 385/135 |
| 2009/0074371 A1* | 3/2009 | Bayazit et al. | 385/135 |
| 2010/0111481 A1 | 5/2010 | Burek | |
| 2011/0069931 A1* | 3/2011 | Cote et al. | 385/100 |
| 2011/0268413 A1* | 11/2011 | Cote et al. | 385/135 |
| 2011/0280535 A1* | 11/2011 | Womack | 385/135 |
| 2012/0193120 A1* | 8/2012 | Edmond | 174/68.3 |

* cited by examiner

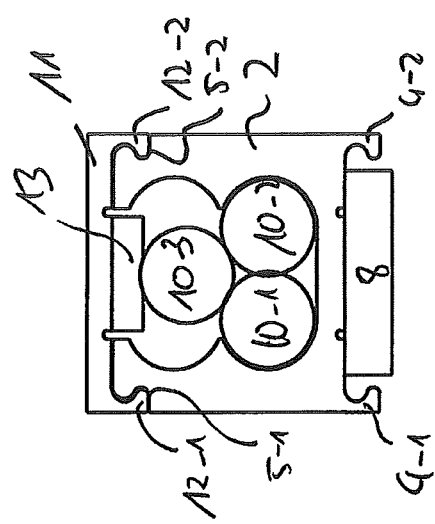

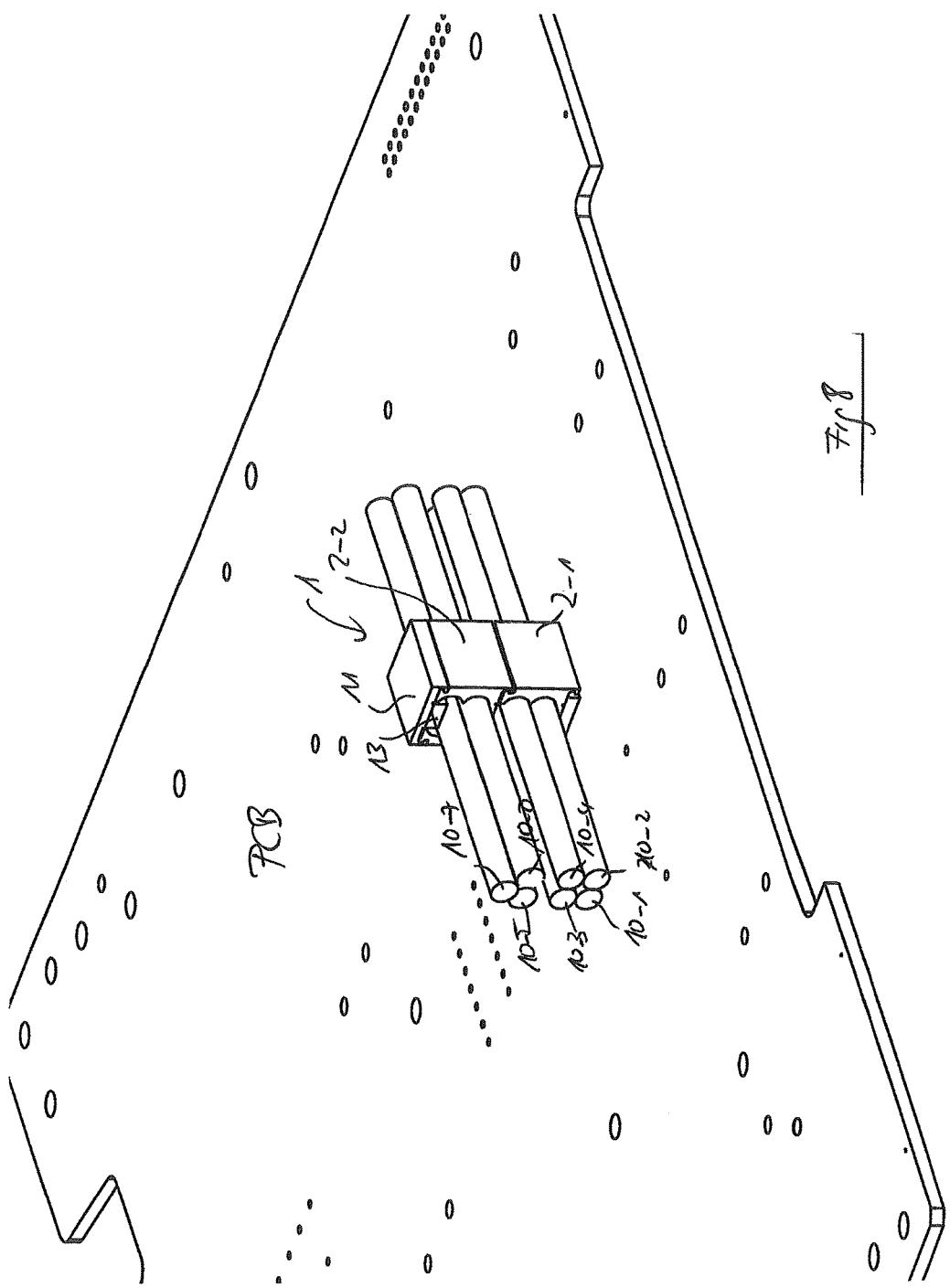

FIBER OPTIC COMPONENT HOLDING DEVICE FOR FIBERS IN SIDE-BY-SIDE CONTACT

TECHNICAL BACKGROUND

The invention relates to a holding device for holding cylindrical fiber optic components of a fiber track on a printed circuit board.

A fiber track on a printed circuit board can comprise different cylindrical fiber optical components which are assembled on a printed circuit board. The cylindrical fiber optical components can comprise for instance photo detectors, fiber optical splices, fiber optical couplers, fiber optical taps, micro-optic wavelength division multiplexers and optical fibers or a bundle of optical fibers.

On a conventional printed circuit board, these different kinds of cylindrical fiber optical components are glued together or spread out on the printed circuit using conventional fiber component holder clips. When gluing different fiber optical components together, this has the severe drawback that a single fiber optical component cannot be separated again or replaced by another fiber optical component. Spreading out the different fiber components on the printed circuit board has the disadvantage that a lot of space is occupied on the printed circuit board. Furthermore, the fiber track assembly can become very confusing to the user leading to connection errors between the different fiber optical components.

Accordingly, there is a need for a holding device which allows easy attachment and removal of fiber optical components and which requires a minimal space on a printed circuit board.

SUMMARY OF THE INVENTION

The invention provides according to a first aspect a holding device for holding cylindrical fiber optical components comprising at least one stackable body each having at least one recess adapted to receive cylindrical fiber optical components.

According to a possible embodiment of the holding device, the stackable body comprises a single recess adapted to receive two adjacent cylindrical fiber optical components in side-by-side contact.

According to a further possible embodiment of the holding device, the stackable body comprises
a lower recess adapted to receive two adjacent cylindrical fiber components in side-by-side contact and
an upper recess adapted to receive two adjacent cylindrical fiber components in side-by-side contact or a single cylindrical fiber component pressed against the two adjacent cylindrical fiber components received by the lower recess by an adhesive contact pad attached to a flexible cap clipped on capture grooves of the stackable body.

According to a further possible embodiment of the holding device according to the first aspect of the present invention, the stackable body comprises capture legs adapted to be clipped on corresponding capture grooves of another stackable body.

According to a further possible embodiment of the holding device according to the first aspect of the present invention, a width of the recess within the stackable body is twice the diameter of a cylindrical fiber optical component.

In a still further possible embodiment of the holding device according to the first aspect of the present invention, the stackable body comprises at a bottom side two capture legs facing each other and at a top side corresponding capture grooves.

In a further possible embodiment of the holding device according to the first aspect of the present invention, the holding device comprises two parallel guiding grooves at the bottom side of the stackable body for attaching a conformable adhesive tape.

In a still further possible embodiment of the holding device according to the first aspect of the present invention, a flexible cap is clipped on capture grooves of the stackable body at the top of the respective stack.

In a still further possible embodiment of the holding device according to the first aspect of the present invention, the lowest stackable body is attached to a printed circuit board by means of a double-side conformable adhesive tape attached to the bottom side of the stackable body at the bottom of the respective stack.

In a still further possible embodiment of the holding device according to the first aspect of the present invention, the lowest stackable body of the respective stack is attached to a printed circuit board by attachment means.

In a still further possible embodiment of the holding device according to the first aspect of the present invention, the stackable body is made of a flexible material.

In a still further possible embodiment of the holding device according to the first aspect of the present invention, the flexible material is a low flammable extruded or molded plastic material.

The invention further provides according to a second aspect a fiber track of a printed circuit board comprising at least one holding device according to the first aspect of the present invention.

In a possible embodiment of the fiber track according to the second aspect of the present invention, the cylindrical fiber optical components held by the holding device comprise photo detectors, micro-optic wavelength division multiplexers, MWDMs, fiber optical splices, fiber optical taps, fiber optical couplers, optical fibers and/or a bundle of optical fibers.

BRIEF DESCRIPTION OF THE FIGURES

In the following, possible embodiments of the different aspects of the present invention are described in more detail with reference to the enclosed figures.

FIG. 7 shows a cross-section view through a stackable body of an exemplary holding device according to the first aspect of the present invention;

FIG. 8 shows a perspective view on an exemplary holding device comprising two stackable bodies according to the present invention.

DETAILED DESCRIPTION OF EMBODIMENTS

The invention provides according to a first aspect a holding device 1 for holding cylindrical fiber optical components comprising at least one stackable body 2. The holding device 1 according to the present invention comprises one or more stackable bodies 2 each having at least one recess 3 adapted to receive cylindrical fiber optical components. The cylindrical fiber optical components held by the holding device 1 can comprise in possible embodiments photo detectors, fiber optical splices, fiber optical taps, fiber optical couplers, micro-optic wavelength division multiplexers, optical fibers or even bundles of optical fibers. Each stackable body 2 has at least one recess 3 adapted to receive cylindrical fiber optical components.

Figure 1:
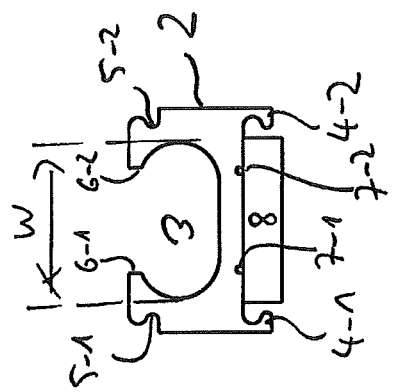
FIG. 1 shows a cross-section view through a possible embodiment of a stackable body used in a holding device according to the first aspect of the present invention.

FIG. 1 shows a possible embodiment of a stackable body 2 of a holding device 1 according to the first aspect of the present invention. In the shown exemplary embodiment, the stackable body comprises a single recess 3 which is adapted to receive two adjacent cylindrical fiber optical components in side-by-side contact (not shown). The stackable body 2 shown in FIG. 1 is made of a flexible material. The flexible material can comprise a low flammable extruded or molded plastic material. In the embodiment shown in FIG. 1, the width W of the recess 3 within the stackable body 2 is twice the diameter of two adjacent cylindrical fiber optical components to be received in side-by-side contact by the recess 3. As can be seen in FIG. 1, the stackable body 2 comprises capture legs 4-1, 4-2 adapted to be clipped on corresponding capture grooves of another stackable body beneath the stackable body 2 shown in FIG. 1. The stackable body 2 itself also comprises capture grooves 5-1, 5-2 to which capture legs from another stackable body are clipped from above. In the embodiment shown in FIG. 1, two adjacent cylindrical fiber optical components can be inserted into the recess 3 through an opening of the recess. The opening is provided between two protrusions or retention brackets 6-1, 6-2, wherein the distance between the protrusions is smaller than the width W of the recess 3. The size of the opening is such that the cylindrical fiber optical components can be easily inserted into the recess 3 and retained after having been inserted into the recess 3. This allows for example an easy removal of the fiber optical components, for example for testing purposes. The capture legs 4-*i* as well as the corresponding capture grooves 5-1, 5-2 allow stacking of multiple stackable bodies 2 upon each other to form a holding device 1. The number of the stackable bodies 2 stacked upon each other in the holding device 1 can vary depending on the application. Each stackable body 2 comprises at a bottom side two capture legs 4-1, 4-2 facing each other and at a top side the corresponding capture grooves 5-1, 5-2. In an alternative embodiment the capture legs are at the top side and the grooves are at the bottom side of the stackable body 2.

In a possible embodiment as shown in FIG. 1, two parallel guiding grooves 7-1, 7-2 are provided at a bottom side of the stackable body 2 for attaching a conformable adhesive tape 8. The adhesive tape 8 can be a double-sided adhesive tape so that the stackable body 2 can be attached to a printed circuit board, PCB, by means of the double-sided adhesive tape 8. The protrusions 6-1, 6-2 of the recess 3 form retention brackets holding back the inserted fiber optical components.

Figure 2:
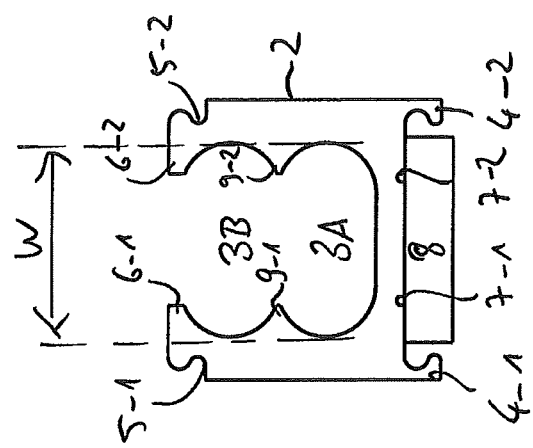
FIG. 2 shows a cross-section view through an alternative embodiment of a stackable body used in a holding device according to the first aspect of the present invention.

FIG. 2 shows a further possible embodiment of a stackable body 2 of a holding device 1 according to the first aspect of the present invention. In the shown embodiment, the stackable body 2 comprises two recesses 3*a*, 3*b*. The stackable body 2 comprises a lower recess 3*a* adapted to receive two adjacent cylindrical fiber components in side-by-side contact. The stackable body 2 further comprises an upper recess 3*b* which is adapted to receive also two adjacent cylindrical fiber components in side-by-side contact or a single cylindrical fiber component which can be pressed against the two adjacent cylindrical fiber components received by the lower recess 3*a* by an adhesive contact pad attached to a flexible cap clipped on the capture grooves 5-1, 5-2 of the stackable body 2. The stackable body 2 as illustrated in FIG. 2 also comprises two capture legs 4-1, 4-2 facing each other and at a top side corresponding capture grooves 5-1, 5-2. The width W of the recesses 3*a*, 3*b* corresponds to twice the diameter of a cylindrical fiber optical component. The upper recess 3*b* comprises an opening for inserting the fiber optical components through an opening between two protrusions or retention brackets 6-1, 6-2. The stackable body 2 of the embodiment of FIG. 2 comprises in the middle between the two recesses 3*a*, 3*b* protrusions 9-1, 9-2 to hold back the inserted fiber optical components received by the lower recess 3*a*. The stackable body 2 of FIG. 2 can also comprise two parallel guiding grooves 7-1, 7-2 at the bottom side of the stackable body 2 for attaching a conformable adhesive tape 8. The double-sided adhesive contact tape 8 allows to attach the stackable body 2 of FIG. 2 to a printed circuit board, PCB.

Figure 3:
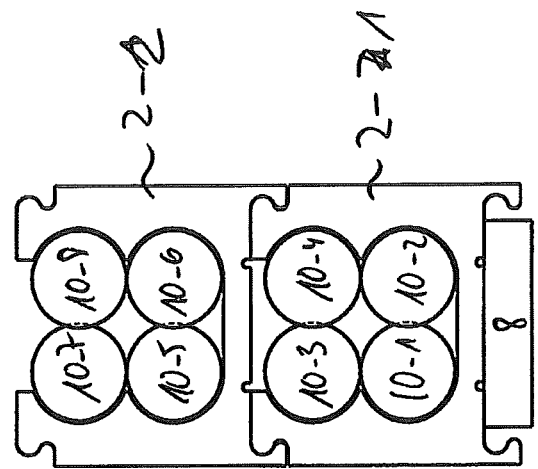
FIG. 3 shows an exemplary holding device comprising two stackable bodies according to the first aspect of the present invention.

FIG. 3 shows a cross-section view to a holding device 1 comprising two stackable bodies 2-1, 2-2. In the shown exemplary embodiment of the holding device 1, both stackable bodies 2-1, 2-2 are formed by stackable bodies with two recesses 3*a*, 3*b* as illustrated in FIG. 2. In each recess 3*a*, 3*b* of both stackable bodies 2-1, 2-2, two adjacent cylindrical fiber optical components 10-*i* are inserted in side-by-side contact. The capture legs of the upper stackable body 2-2 are clipped on the corresponding capture grooves of the lower stackable body 2-1 as illustrated in FIG. 3. At the lower stackable body 2-1, a double-sided adhesive contact pad or tape 8 is attached which allows to connect the holding device 1 to a printed circuit board, PCB. In the exemplary embodiment of FIG. 1, first, the lower stackable body 2-1 is attached to the printed circuit board, PCB, and the cylindrical fiber optical components 10-1 to 10-4 are inserted into the recesses 3*a*, 3*b* of the first stackable body 2-1. After having inserted the fiber optical component 10-1 to 10-4 into the lower stackable body 2-1, the upper stackable body 2-2 is clipped by means of its capture legs onto the capture grooves of the lower stackable body 2-1. After that, the remaining four cylindrical fiber optical components 10-6 to 10-8 are inserted into the recesses 3*a*, 3*b* of the upper stackable body 2-2. In the exemplary embodiment of FIG. 1, the holding device 1 of FIG. 3 is adapted to receive and retain eight fiber optical components 10-1 to 10-8. In the exemplary embodiment of FIG. 3, further stackable bodies can be clipped on the upper stackable body 2-2 to increase the number of retained cylindrical fiber optical components 10-*i*.

Figure 4:
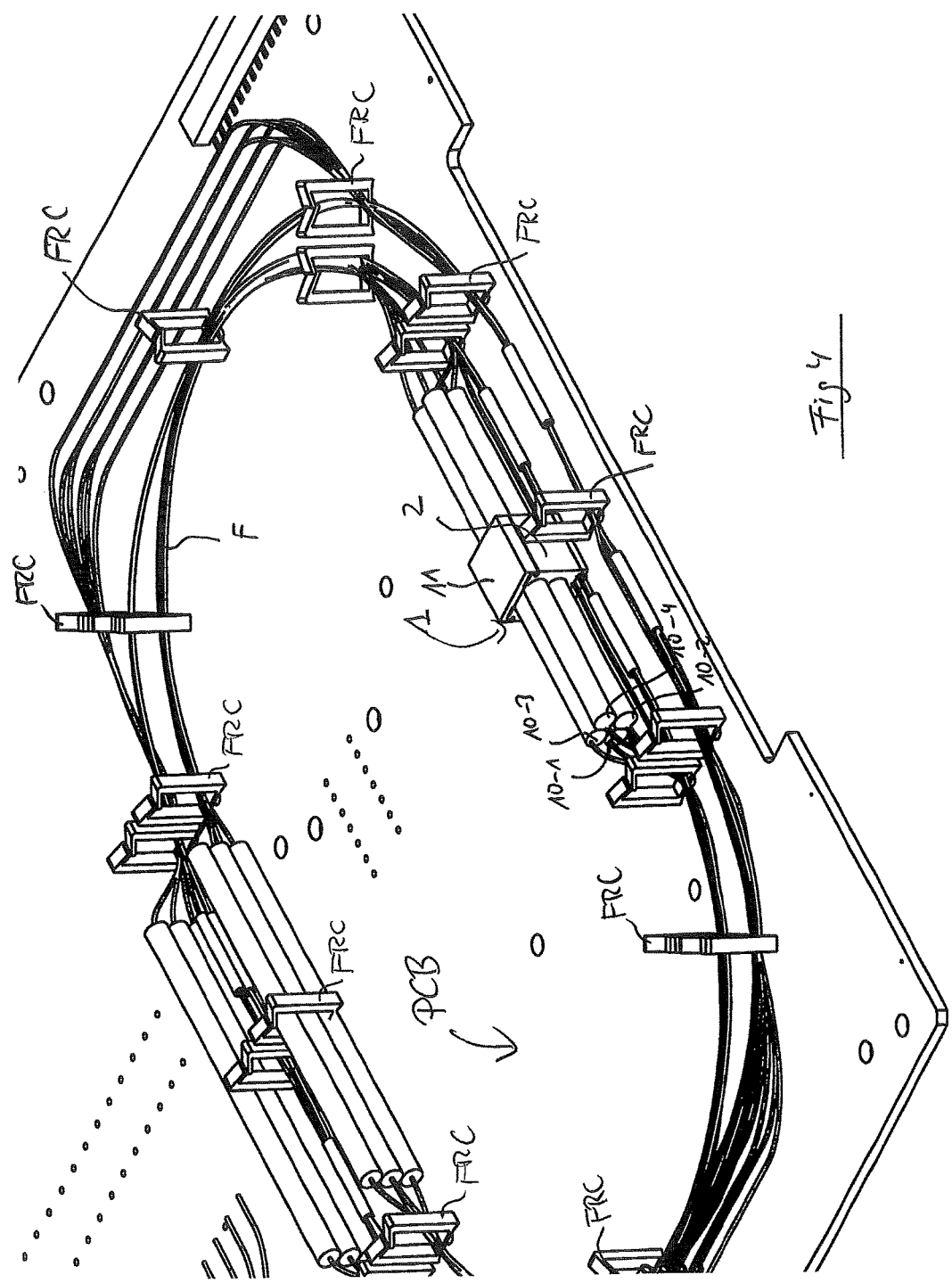
FIG. 4 shows a perspective view on an exemplary fiber track comprising a holding device according to the present invention.

FIG. 4 shows a perspective side view on a printed circuit board, PCB, comprising a holding device 1 consisting of one stackable body 2 having two recesses 3*a*, 3*b* for receiving four cylindrical fiber optical components 10-1, 10-2, 10-3, 10-4. In the shown exemplary embodiment, the opening of the stackable body 2 is closed by means of a flexible cap 11 clipped on the capture grooves 5-1, 5-2 of the stackable body 2. The stackable body 2 can be attached to the printed circuit board, PCB, by a double-side conformable adhesive tape attached to the bottom side of the stackable body 2. The cylindrical fiber optical components 10-*i* held by the holding device 1 can comprise photo detectors, micro-optic wavelength division multiplexers, MWDMs, fiber optical splices, fiber optical taps, fiber optical couplers, optical fibers or a bundle of optical fibers. The fiber track comprises a plurality of optical fibers which can be retained by fiber retention clips, FRC.

Figure 5:
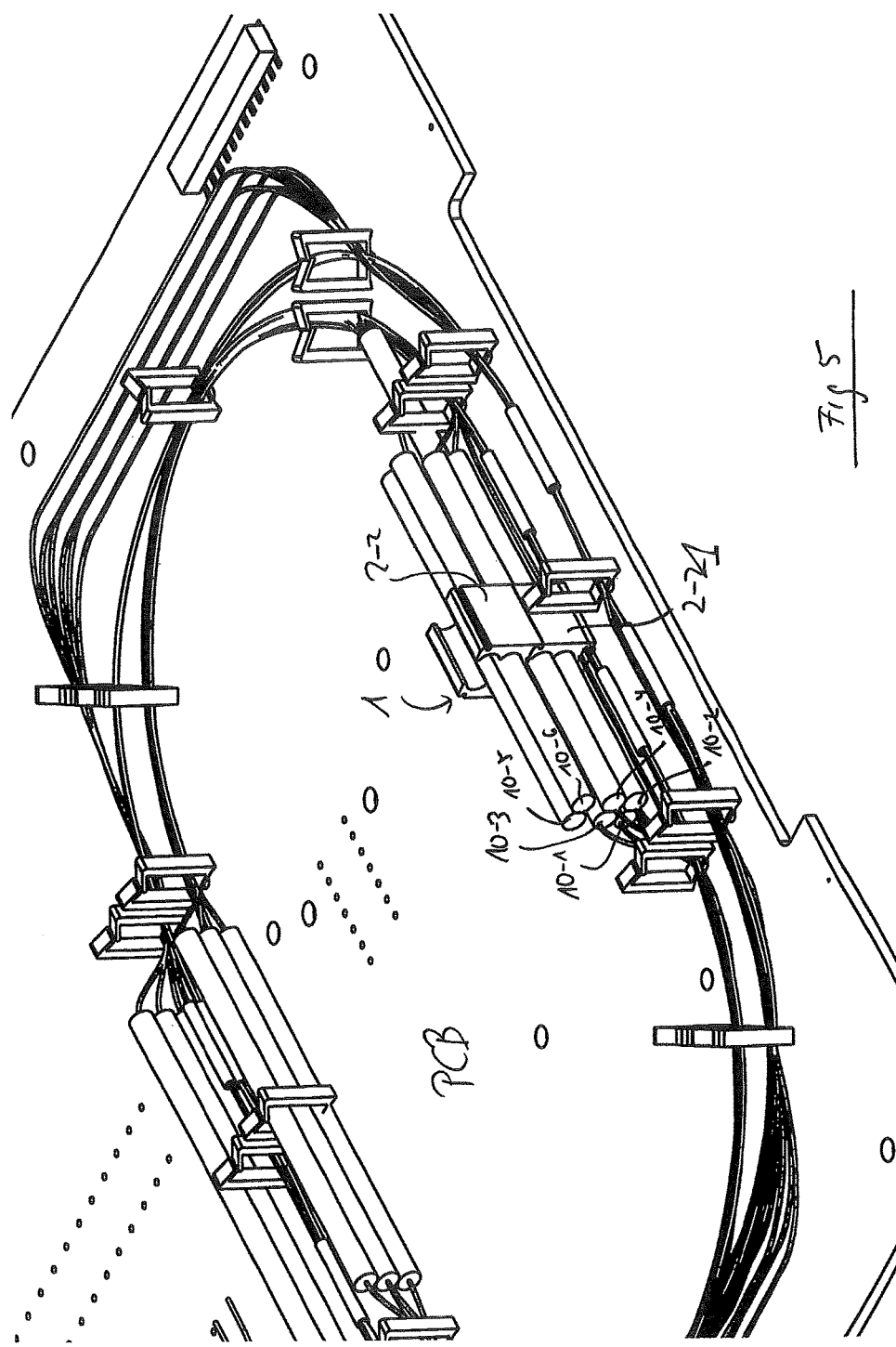
FIG. 5 shows an exemplary side view on a fiber track when mounting an exemplary holding device according to the present invention on a printed circuit board.

FIG. 5 shows a further exemplary perspective side view on a printed circuit board, PCB, comprising a holding device 1 according to the first aspect of the present invention. FIG. 5 shows a holding device 1 with two stackable bodies 2-1, 2-2 stacked upon each other as shown in FIG. 3. In the shown exemplary embodiment, the holding device 1 comprising two stackable bodies 2-1, 2-2 which receive six cylindrical fiber optical components 10-1 to 10-6. As can be seen in FIG. 5, it is not necessary to clip a flexible cap 11 onto the stackable body 2-2 on the top of the holding device 1. This is because the lower recess 3*a* of the stackable body 2-2 is formed such that two adjacent cylindrical fiber optical components 10-5 to 10-6 are retained in side-by-side contact after being inserted into the respective recess. The lower stackable body 2-1 is attached to the printed circuit board, PCB, by means of a double-side conformable adhesive tape 8 attached to the bottom side of the stackable body 2-1 at the bottom of the respective stack.

Figure 6:
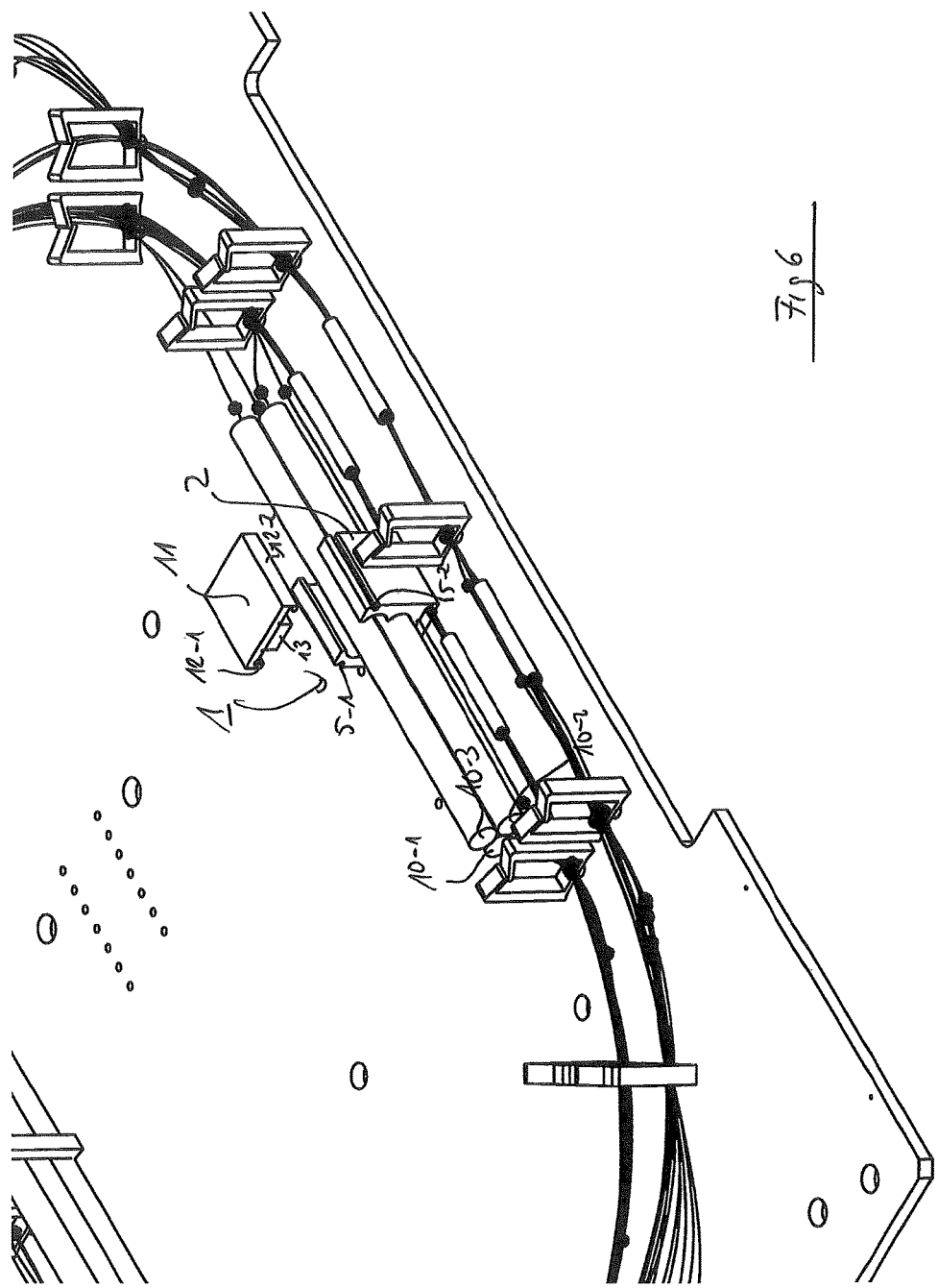
FIG. 6 shows a perspective side view for illustrating the mounting of an exemplary holding device according to the present invention on a printed circuit board.

FIG. 6 shows a further exemplary fiber track comprising a holding device 1 according to the present invention. In this exemplary embodiment, the holding device 1 comprises a single stackable body 2 having a lower recess 3*a* and an upper recess 3*b*. In the embodiment of FIG. 6, the stackable body 2 receives three cylindrical fiber optical components 10-1, 10-2, 10-3. The stackable body 2 having two recesses 3*a*, 3*b* can receive a maximum of four cylindrical fiber optical components 10-1 to 10-4. In the exemplary embodiment of FIG. 6, the fiber track comprises only three fiber optical components 10-1, 10-2, 10-3 which are inserted into the stackable body 2 of the holding device 1. Since the upper recess 3*b* of the stackable body 2 receives in the shown exemplary embodiment not two adjacent cylindrical fiber optical components but a single fiber optical component 10-3, a flexible cap 11 is clipped by means of capture legs 12-1, 12-2 on the capture grooves 5-1, 5-2 of the stackable body 2. As can be seen in FIG. 6, the flexible cap 11 comprises on the lower side a small adhesive contact pad 13 to retain the third fiber optical component 10-3.

FIG. 7 shows a cross-section view through the holding device 1 of the fiber track as illustrated in FIG. 6. As can be seen in FIG. 7, a single cylindrical fiber component 10-3 in the upper recess 3*b* of the stackable body 2 is pressed against the two adjacent cylindrical fiber components 10-1, 10-2 received by the lower recess 3*a* by the adhesive contact pad 13 attached to the flexible cap 11 clipped on the capture grooves 5-1, 5-2 of the stackable body 2 by means of capture legs 12-1, 12-2.

FIG. 8 shows a further exemplary perspective view on a holding device 1 comprising a lower stackable body 2-1 and an upper stackable body 2-2. In the exemplary embodiment of FIG. 8, the lower stackable body 2-1 is adapted to receive four cylindrical fiber optical components 10-1, 10-2, 10-3, 10-4 received by the lower and upper recesses 3*a*, 3*b* of the lower stackable body 2-1. The upper stackable body 2-2 is clipped on the lower stackable body 2-1 and is provided to receive three fiber optical components 10-5, 10-6, 10-7, wherein the lower recess 3*a* receives two adjacent cylindrical fiber optical components 10-5, 10-6 in side-by-side contact, and the upper recess 3*b* receives a single fiber optical component 10-7 retained by means of a flexible cap 11 clipped on the upper stackable body 2-2 and having at its lower side a small adhesive contact pad 13 pressing the fiber optical component 10-7 on the lower fiber optical components 10-5, 10-6.

Accordingly, the holding device 1 according to the present invention can be used to receive an even or odd number of cylindrical fiber optical components 10-*i*. For example, in the embodiment shown in FIG. 5, the holding device 1 is adapted to receive an even number of cylindrical fiber optical components 10-1 to 10-6. If the holding device is provided for receiving an even number of cylindrical fiber optical components 10-*i* it is not necessary to clip a flexible cap 11 on the capture grooves of the stackable body 2 at the top of the respective stack.

In contrast, in the embodiment as illustrated for instance in FIG. 8, the holding device 1 comprises two stackable bodies and receives an odd number of cylindrical fiber optical components 10-1 to 10-7. In this embodiment, a flexible cap 11 is clipped on the capture grooves of the stackable body 2-2 at the top of the respective stack to retain the cylindrical fiber optical component 10-7. Since the number of stackable bodies 2-*i* can vary, the number of retained cylindrical fiber optical components 10-*i* can also vary depending on the respective application.

The holding device 1 according to the present invention allows for a minimal board space footprint of the holding device 1. The footprint of the base stackable body 2-1 at the bottom of the stack requires a minimal space on the printed circuit board, PCB. The stackability of a plurality of stackable bodies 2-*i* allows for a great capacity to receive a plurality of cylindrical fiber optical components 10-*i* requiring a minimum of board space of the printed circuit board, PCB. Moreover, with the holding device 1 according to the present invention, the cylindrical fiber optical components 10-*i* can be easily removed for testing or replaced by other cylindrical components.

It is possible to use in a holding device different kinds of stackable bodies 2-*i* each having recesses 3 of different widths w for different cylindrical fiber optical components. This allows to hold cylindrical components of varying diameter. In a possible embodiment, the stackable bodies 2-*i* with the same or different size of the recesses 3 can be clipped on each other in a modular system. Accordingly, an operator or user can attach a high number of different cylindrical optical components 10-*i* on a printed circuit board, PCB, without getting confused so that connection errors are minimized. In a possible embodiment, the cylindrical components can comprise for instance a diameter of 3 mm. This allows for a narrow profile of the retention brackets 6-1, 6-2 of the stackable body 2.

The invention claimed is:

1. A holding device for holding at least two cylindrical fiber optical components, each having a diameter, the holding device comprising at least one stackable body, each stackable body having at least one recess, the recess defining a width between opposite ends thereof that is no greater than twice the diameter of two cylindrical fiber optical components, the recess being configured to receive and to hold the two cylindrical fiber optical components together in side-by-side contact within the recess and in contact with said opposite ends of the recess, wherein said recess defines an opening between said opposite ends through which the two cylindrical fiber optical components are inserted into the recess, said opening having a width that is less than the width of said recess.

2. The holding device according to claim 1, wherein the stackable body comprises a single recess adapted to receive two adjacent cylindrical fiber optical components in a side-by-side relationship.

3. The holding device according to claim 1, wherein the stackable body comprises:
a lower recess adapted to receive two adjacent cylindrical fiber components in a side-by-side relationship; and
an upper recess adapted to receive two adjacent cylindrical fiber components in a side-by-side relationship.

4. The holding device according to claim 3, wherein the cap is configured to cover or close the upper recess in the stackable body.

5. The holding device according to claim 3, wherein the cap is flexible and is clipped on the stackable body via capture grooves, and wherein the contact pad is an adhesive contact pad attached to the flexible cap.

6. The holding device according to claim 1, wherein each stackable body includes capture grooves and capture legs adapted to be clipped on corresponding capture grooves of another stackable body.

7. The holding device according to claim 1, wherein the stackable body comprises at a bottom side two capture legs facing each other and at a top side corresponding capture grooves.

8. The holding device according to claim 7, wherein two parallel guiding grooves are provided at the bottom side of said stackable body for attaching a conformable adhesive tape.

9. The holding device according to claim 7, wherein said cap is flexible and is clipped on capture grooves of the stackable body at the top of the respective stack.

10. The holding device according to claim 7, wherein a lowest stackable body is attached to a printed circuit board by means of a double-side conformable adhesive tape attached to the bottom side of the stackable body at the bottom of the respective stack.

11. The holding device according to claim 7, wherein a lowest stackable body of the respective stack is attached to a printed circuit board, PCB, by attachment means.

12. The holding device according to claim 1, wherein the stackable body is made of a flexible material.

13. The holding device according to claim 12, wherein the flexible material is a low flammable extruded or molded plastic material.

14. A fiber track of a printed circuit board, PCB, comprising at least one holding device according to claim 1.

15. The fiber track according to claim 14, wherein the cylindrical fiber optical components held by said holding device comprise photo detectors, micro-optic wavelength division multiplexers, MWDMs, fiber optical splices, fiber optical taps, fiber optical couplers, optical fibers and/or a bundle of optical fibers.

16. The holding device according to claim 1, wherein the recess is generally U-shaped and comprises opposite inner sides having a curvature complementary to a circumference of the two adjacent cylindrical fiber optical components.

17. The holding device according to claim 1, wherein the stackable body comprises:
a lower recess adapted to receive two adjacent cylindrical fiber components in a side-by-side relationship;
an upper recess adapted to receive a single cylindrical fiber component in contact with said two adjacent cylindrical fiber components received in the lower recess; and
a cap engaged to the stackable body and including a contact pad bearing against said single cylindrical fiber component within said upper recess to press said single cylindrical fiber component against said two adjacent cylindrical fiber components.

18. A holding device for holding at least two cylindrical fiber optical components, the device comprising at least one stackable body, each stackable body including:
at least one recess having opposite ends and configured to receive and to hold two adjacent cylindrical fiber optical components together in a side-by-side contact within the recess between said opposite ends, the recess defining an opening between said opposite ends through which the two cylindrical fiber optical components are inserted into the recess;
capture grooves defined in said body; and
capture legs defined in said body,
wherein one of said capture grooves and said capture legs is defined in said body adjacent said opening at said opposite ends of the recess and the other of said capture grooves and said capture legs is defined at a portion of said body opposite said opening,
wherein said capture legs are adapted to be received within corresponding capture grooves of another stackable body such that said another stackable body covers said opening of the recess.

19. The holding device according to claim 18, wherein the stackable body is made of a flexible material so that said body flexes said recess at said capture grooves to receive said capture legs within said capture grooves.

* * * * *